United States Patent

Collins et al.

[11] Patent Number: 5,545,283
[45] Date of Patent: Aug. 13, 1996

[54] APPARATUS FOR BONDING WAFER PAIRS

[75] Inventors: David J. Collins; Daniel E. Kuhman, both of Fairport; Herman A. Hermanson, Penfield, all of N.Y.

[73] Assignee: Xerox Corporation, Stamford, Conn.

[21] Appl. No.: 385,234

[22] Filed: Feb. 8, 1995

Related U.S. Application Data

[63] Continuation of Ser. No. 118,532, Sep. 9, 1993, abandoned.

[51] Int. Cl.$^6$ ................................. B32B 31/20
[52] U.S. Cl. .................. 156/382; 156/285; 156/286; 156/583.3; 269/21; 269/22
[58] Field of Search .................. 269/21, 22; 156/382, 156/285, 286, 583.3; 148/DIG. 12

[56] References Cited

U.S. PATENT DOCUMENTS

| | | | |
|---|---|---|---|
| 2,397,827 | 4/1946 | Williams | 156/285 |
| 3,085,925 | 4/1963 | Schliekelmann | 156/285 |
| 3,551,232 | 12/1970 | Thompson | 156/286 X |
| 3,740,900 | 6/1973 | Youmans et al. | 269/21 |
| 3,945,879 | 3/1976 | Fletcher et al. | 156/286 X |
| 4,535,721 | 8/1985 | Yakura | 118/503 |
| 4,596,624 | 6/1986 | Frohlich et al. | 156/382 |
| 4,804,582 | 2/1989 | Noding et al. | 428/332 |
| 4,818,323 | 4/1989 | d'Aragona et al. | 156/286 |
| 4,822,651 | 4/1989 | Newson | 269/21 |
| 4,886,442 | 12/1989 | McCowin et al. | 156/382 X |
| 4,953,287 | 9/1990 | West et al. | 29/611 |
| 5,054,683 | 10/1991 | Haisma et al. | 228/198 |
| 5,105,430 | 4/1992 | Mundinger et al. | 372/35 |
| 5,108,532 | 4/1992 | Thein et al. | 156/382 X |
| 5,116,216 | 5/1992 | Cochran et al. | 156/382 X |
| 5,131,968 | 7/1992 | Wells et al. | 156/153 |
| 5,242,652 | 9/1993 | Savigny | 264/510 |
| 5,297,480 | 3/1994 | Miyashita et al. | 156/382 X |
| 5,300,175 | 4/1994 | Gardner et al. | 156/285 |
| 5,324,012 | 6/1994 | Aoyama et al. | 269/21 |
| 5,439,205 | 8/1995 | Häberle | 269/21 |

FOREIGN PATENT DOCUMENTS

| | | | |
|---|---|---|---|
| 159043 | 6/1992 | Japan | 269/21 |
| 1171360 | 8/1985 | U.S.S.R. | 156/382 |

*Primary Examiner*—Michele K. Yoder
*Attorney, Agent, or Firm*—Daniel J. Krieger

[57] ABSTRACT

An apparatus and method for bonding wafer pairs. The apparatus includes a heated platen surrounded by a pressurization vessel. The heated platen includes channels connected to a hole which runs through the heated platen. Wafer pairs are placed on the top surface of the platen, a rubber mat is placed over the top of the wafer pairs, and a vacuum is drawn through the hole and the channels. The rubber mat compresses the wafer pairs. The platen is heated for the bonding process. The pressurization chamber is pressurized supplying additional bonding pressure to the wafer pair. Once sufficiently heated, the heated platen is liquid cooled completing the bonding process.

16 Claims, 5 Drawing Sheets

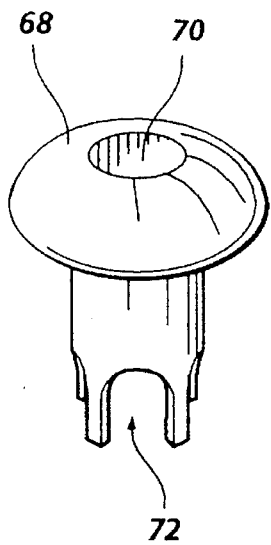
FIG. 3
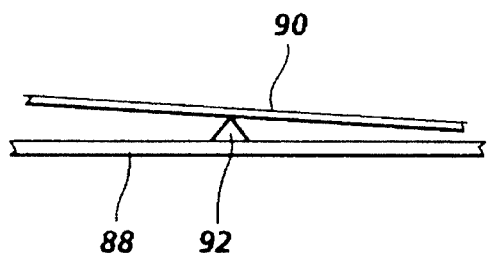 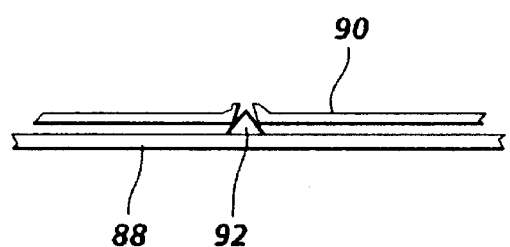
FIG. 6A　　　　　　　FIG. 6B

APPARATUS FOR BONDING WAFER PAIRS

This is a continuation of application Ser. No. 08/118,532, filed Sep. 9, 1993, now abandoned.

FIELD OF THE INVENTION

This invention relates generally to the bonding of silicon wafers and more particularly to a method and apparatus using heat and pressure to bond wafers for the fabrication of ink jet printheads.

BACKGROUND OF THE INVENTION

Silicon wafers when bonded together are used in a variety of applications. Bonded silicon wafers are used to produce many types of devices including pressure sensors, insulated gate bipolar transistors, CMOS devices, high voltage transistors, and thermal ink jet printheads. Any number of silicon wafers can be bonded together, however, a majority of applications require the bonding of two silicon wafers. A silicon wafer pair, if properly bonded, can produce, depending on wafer size, up to several hundred or more individual thermal ink jet printheads.

Silicon wafer pairs are typically bonded together by the application of heat, electricity, pressure or any combination thereof. The application of heat is typically required to bond wafer pairs which have an adhesive bond or a chemical bond. The heat causes a chemical reaction to take place between the wafer pair or causes an adhesive to melt so that the wafer pairs bond together. The application of pressure to the wafer pairs insures that a bond takes hold with sufficient contacting force between the surfaces.

Different methods of applying pressure have been tried with varying success. One simple method used is to mate and align the wafers and place a weight on top of the wafer pair. Such a method is not extremely accurate, but wafers do bond with this method, although the yield rate of individual devices suffers. Another method uses a mechanical plunger having a rigid flat surface which contacts the top surface of the wafer pair. The mechanical plunger, is either driven from the top by mechanical force or is pulled down by the application of a vacuum to the underside of the plunger which is attached to a vacuum seal.

Mechanical plungers, however, suffer from the fact that the pressure may not be applied equally throughout the surfaces of the wafers, thereby causing inconsistent bonding throughout the wafer pair. In addition, due to the strict tolerances required in the bonding process, it is quite difficult, if not impossible, to bond more than one assembly or wafer pair at a time with any degree of success using methods applying top pressure through a flat rigid surface.

In U.S. Pat. No. 4,535,721 to Yakura, a process for making a stacked high voltage rectifier of silicon wafers is described. Wafers are prepared with dopant material, stacked, and held in a compression jig which maintains a substantial pressure on the wafer stack while it is heated.

U.S. Pat. No. 4,818,323 to d'Aragona et al. describes a silicon wafer bonding technique utilizing low pressures and a dissolvable gas to substantially eliminate voids formed between the bonding surfaces of the two wafers. Wafers are joined and placed in a low or reduced pressure furnace and heated at a temperature of about 800 degrees centigrade for approximately one hour.

U.S. Pat. No. 4,953,287 to West et al. describes a thermal bonding apparatus comprising an air actuated ram with a flange having an O-ring seated therein to seal a pliable sheet against a vacuum chuck. The vacuum chuck holds a printhead assembly. Pressurized air is admitted into a chamber included in the ram to force the pliable sheet against the printhead assembly during heating to bond the printhead assembly.

U.S. Pat. No. 5,054,683 to Haisma et al. describes a method of bonding together two bodies, the first body having a flat surface and the second body coated with a silicon oxide layer and also having a flat surface. A connecting layer of boron is applied to one of the flat surfaces and the bodies are pressed against one another for a time at an elevated temperature.

U.S. Pat. No. 5,105,430 to Mundinger et al. describes a laser diode array and cooling means that are connected in a compact, thin planar assembly having the laser diode located proximate to one edge. The planar assemblies comprise three wafers. The wafers are aligned and bonded in a conventional alignment jig which contains vacuum holes positioned adjacent to corresponding holes in the center.

U.S. Pat. No. 5,131,968 to Wells et al. describes an apparatus and method for bonding wafers together. A first wafer is vacuum mounted on a flat chuck and a second wafer is mounted on a convex pressure gradient chuck. The chucks are moved together once the wafers have been scrubbed and polished. The convex pressure gradient chuck applies a pressure gradient to the wafer surfaces for bonding.

SUMMARY OF THE INVENTION

In accordance with one aspect of the invention, there is provided an apparatus for bonding a component pair. The apparatus for bonding a component pair includes a member to support the component pair and a flexible member defining with the member a vacuum chamber having the component pair disposed therein. In addition, the apparatus for bonding the component pairs includes a heater for heating the component pair and a pressure member defining a pressure chamber having at least the member and the flexible member disposed therein. The pressure member increases the pressure in the pressure chamber to effect bonding of the component pair.

Pursuant to another aspect of the invention, there is provided a method for bonding a component pair. The method for bonding a component pair includes the steps of supporting one component which is adjacent to another component. The components have a bonding material interposed between the two components to form an unbonded component pair. The unbonded component pair is covered so that an internal chamber and an external chamber are defined. The internal chamber contains the unbonded component pair. The unbonded component pair is heated and the pressure in the internal chamber is decreased and the pressure in the external chamber is increased to form a bonded component pair.

BRIEF DESCRIPTION OF THE DRAWINGS

FIG. 3 is an elevational view of a hole insert used in the present invention.

FIGS. 6A and 6B are schematic illustrations of the compression of two wafers and the effects of a defect on one of the wafers.

While the present invention will be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

DETAILED DESCRIPTION OF THE INVENTION

Figure 1:
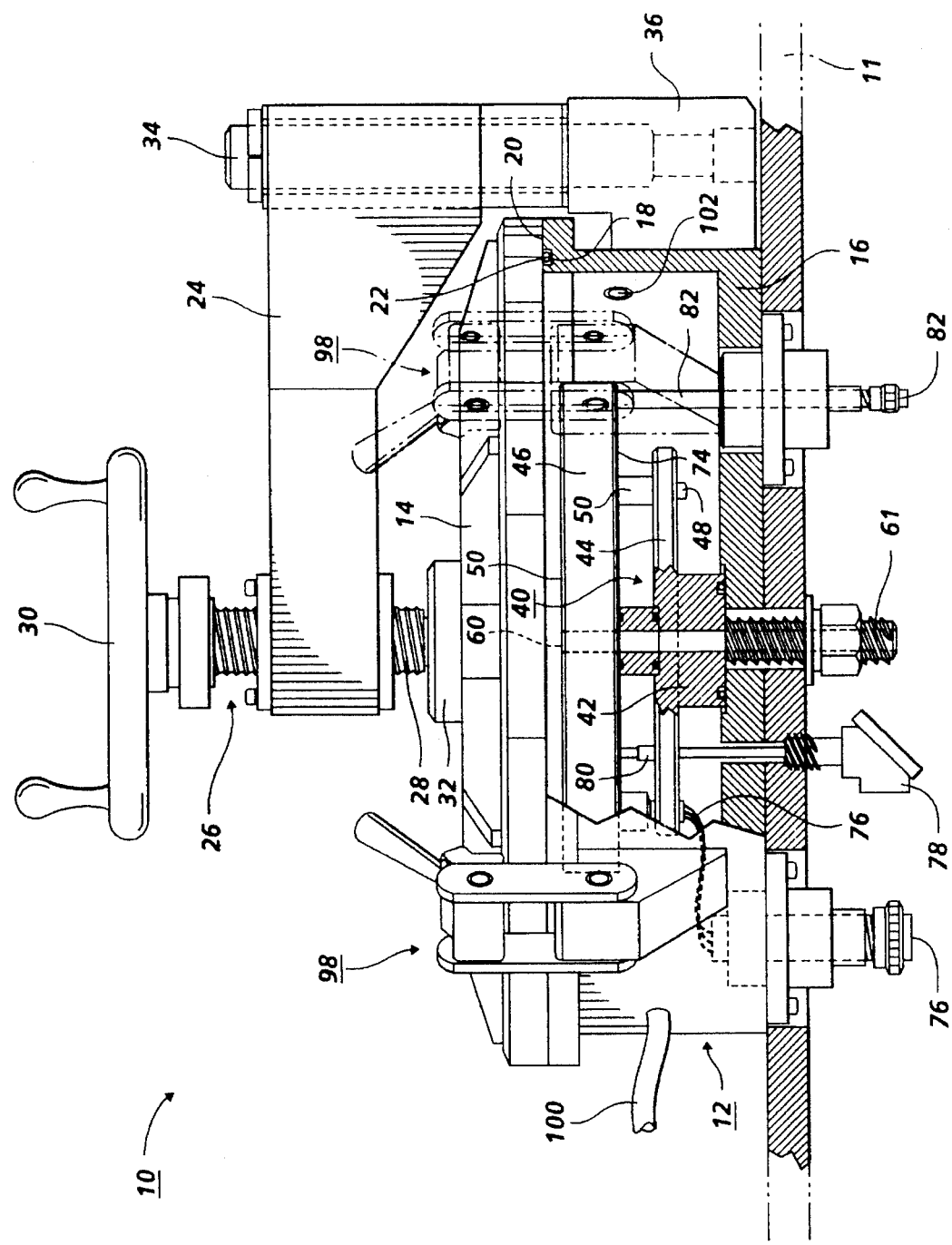
FIG. 1 is an elevational view, partially in section, of the wafer bonding apparatus.

FIG. 1 illustrates a wafer bonding apparatus 10 of the present invention mounted to a table 11. The wafer bonding apparatus 10 includes a pressurization vessel 12 having a lid 14 and a cylindrical bottom portion 16. The bottom portion 16 is a one piece milled aluminum container having a groove 18 formed into a top edge 20 of the bottom portion 16. Stainless steel or other materials can also be used if sufficient to withstand selected temperatures and pressures. The groove 18 is formed to accommodate an O-ring 22 which is used to seal the bonding apparatus 10 once the lid 14 is in position over the bottom portion 16 for pressurization. The lid 14 is suspended from an arm 24 by a screw mechanism 26 comprising a screw 28, attached to a handle 30 and a flange 32 which is attached to the lid 14. The arm 24 pivots about a pivot point 34 which is mounted to a bracket 36 attached to the bottom portion 16.

A support structure 40 is mounted interior to and to the inside bottom of the bottom portion 16. The support structure 40 has a stand 42 which supports a shelf 44. The shelf 44 supports a platen 46 upon which substrates or wafer pairs are placed for bonding. The platen 46 is attached to the shelf 44 by a bolt or other means. A bolt/nut assembly 48 couples the shelf 44 to the platen 46. Additional bolt/nut assemblies are not show for clarity of illustration. An insulating spacer 50 is used to separate the shelf 44 from the platen 46 to provide thermal insulation between the shelf and the platen.

In the present invention, wafer pairs are bonded together to form a multiplicity of thermal ink jet printheads. The thermal ink jet printheads are made by bonding a heater wafer to a channel wafer. The channel wafer has a plurality of sets of channels with associated manifolds. The heater wafer is a solid wafer without holes through the wafer and has a plurality of sets of heating elements and addressing electrodes. The process to bond the assembly comprised of wafer pairs includes holding the wafer pairs in compressed alignment during the application of heat. The wafers are bonded by applying bonding material or a layer of adhesive to the channel wafer and the two wafers are mated together and aligned with respect to one another. Once aligned, the wafers are tacked together by the application of a cyano acrylate adhesive at a few points on the channel wafer to maintain a modicum of alignment before bonding takes place. U.S. Pat. Nos. 32,572 and 4,678,529 describe a bonding process for the production of thermal ink jet printheads in detail and are herein incorporated by reference.

The platen 46 is constructed in the shape of a disk having a diameter of approximately twelve inches and a thickness of approximately one inch. These measurements are not critical and were chosen to accommodate the bonding of four wafer pairs at a time, each having a diameter of approximately four inches. The surface of the platen 46 is covered with Teflon™ or polytetrafluoroethylene to provide a non-stick surface to prevent bonded wafer pairs from sticking thereto.

Figure 2:
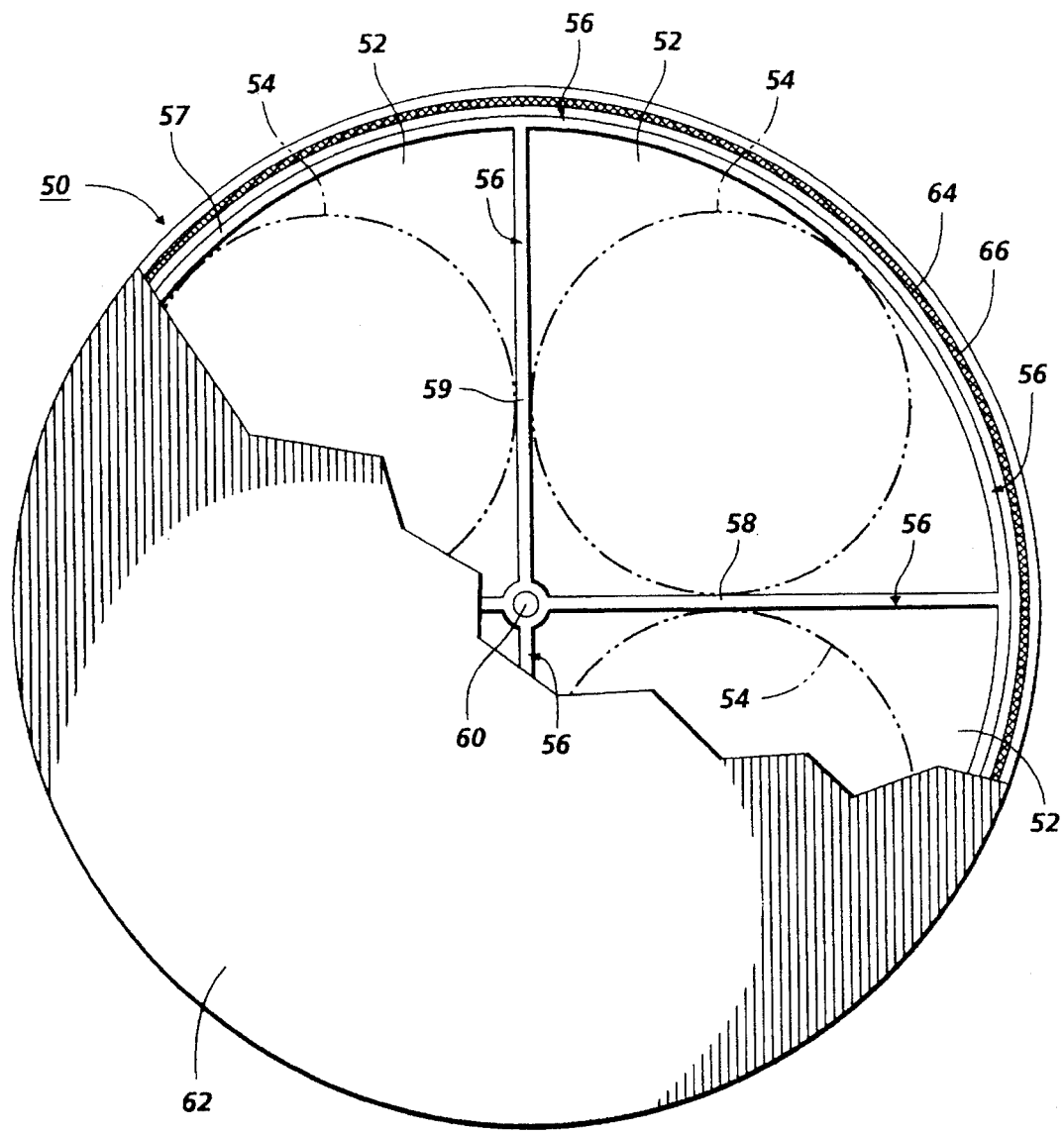
FIG. 2 is a plan view, partially in section, of the platen of the wafer bonding apparatus including four wafer pairs and a portion of the rubber mat.

As seen in FIG. 2, the top surface 50 of the platen 46 is divided into four regions or zones 52. Each of the zones is approximately one quarter of the top circular surface 50. Each zone is sufficiently large to accommodate an assembly or single wafer pair 54. Other shapes of zones are also possible, the shape being a function of the size of the platen, the wafer size, and the number of wafer pairs 54 being bonded at a time. For instance, if two wafer pairs are bonded at a time and a disk shaped platen is used, each zone might be a semicircle. Because the proper bonding of the wafer pairs requires that the surfaces of bonded wafers be as parallel to each other as possible, the surface of the platen in each of the zones is made to be substantially flat. In the present embodiment, this surface is made to conform to a flatness of twelve micrometers across the flat.

Each zone 52 is separated from the other zones 52 by a groove or a plurality of grooves 56 including an outer-circular groove 57 and a first and second cross-groove 58 and 59 respectively. The grooves 56, separating the zones 52, are formed into the surface 50 of the platen 46. Each of the grooves 56 are coupled to a hole 60 which runs through the entire platen 46 as seen in FIG. 1. The hole 60 is coupled to a vacuum line 61 which runs through the shelf 44, the support 42 and the bottom portion 16. The vacuum line 61 is coupled to a vacuum source (not shown) which is used to draw a vacuum through the hole 60 and the grooves 56.

The vacuum drawn through the hole and grooves 56 is used in combination with a flexible member such as a rubber sheet or mat 62 (only a portion is shown so as not to cover up the wafer pairs and other features of the platen) which essentially covers the entire top surface 50 of the platen 46. A seal is made between the mat 62 and a sealing gasket or an O-ring 64 which is held by a sealing groove 66. Once the wafer pairs are placed in the zones 52, the mat 62 is placed over the top of the wafer pairs, the surface 50 of the platen 46, and the O-ring 64. The mat 62 contacts the entire top surface of each wafer pair, the top surface of the platen surrounding the outer periphery of each wafer pair, the channels 56, the hole 60, and the O-ring 64.

The mat 62 is made of a silicone rubber impregnated with carbon for the dissipation of static electricity. Carbon impregnation is desirable to provide static conduction to reduce the amount of particles which collect on the mat due to static electricity. The presence of these particles could contaminate the wafer pairs during bonding. Other flexible materials can be used, however, although such mats may require more frequent cleaning to remove attracted particles. In addition, it has been found that a piece of circular Teflon sheet or other non-stick flexible material placed individually over and covering the entire top surface of each wafer pair prevents the wafer pairs from sticking to the mat once the bonding process is complete.

A vacuum is drawn through the hole 60 and the grooves 56 to pull the mat 62 to the surface 50. The mat is pulled down at the outer circular groove 57, at each cross-groove 58 and 59, the hole 60 and against the O-ring 64. As the grooves are outside the outer periphery of each of the wafer pairs, the mat is pulled down across the outside edges of the wafer pairs thereby holding the wafer pairs in place and maintaining the alignment of the previously aligned wafer pairs. In addition, because the mat 62 provides a means for holding the wafer pairs 54 in place during the bonding process, the wafer pairs do not require a mechanical fixture having recesses or side walls for holding the wafer pairs in place nor does the mat 62 require a mechanical means for sealing the mat 62 against the O-ring 64. The vacuum also compresses the channel wafers to the heater wafers. The application of the vacuum supplies approximately 14 pounds per square inch of downward force to the wafer pairs.

In the present embodiment, the grooves 56 are essentially rectangular in shape, with the depth of the groove being greater than the width of the groove. Other groove shapes can also be used. For instance, the grooves 56 could also be of a triangular shape with the apex of the triangle deepest in the platen 46. The shape is not critical as long as the chosen shape prevents the mat from being drawn into the groove under the influence of the vacuum which could cut off the vacuum to some or all of the grooves 56.

Another feature which prevents the mat 62 from cutting off the vacuum is a hole insert 68. The hole insert 68 is also shown in FIG. 3. The hole insert 68 fits in the hole 60 and includes a hole 70 through the center of the hole insert 68 and four groove holes 72. When the hole insert 68 is placed in the hole 60 of the platen 46, the mat 62 is prevented from blocking the hole 60 since the groove holes 72 are positioned such that the mat 62 cannot close off the vacuum supply.

Figure 4:
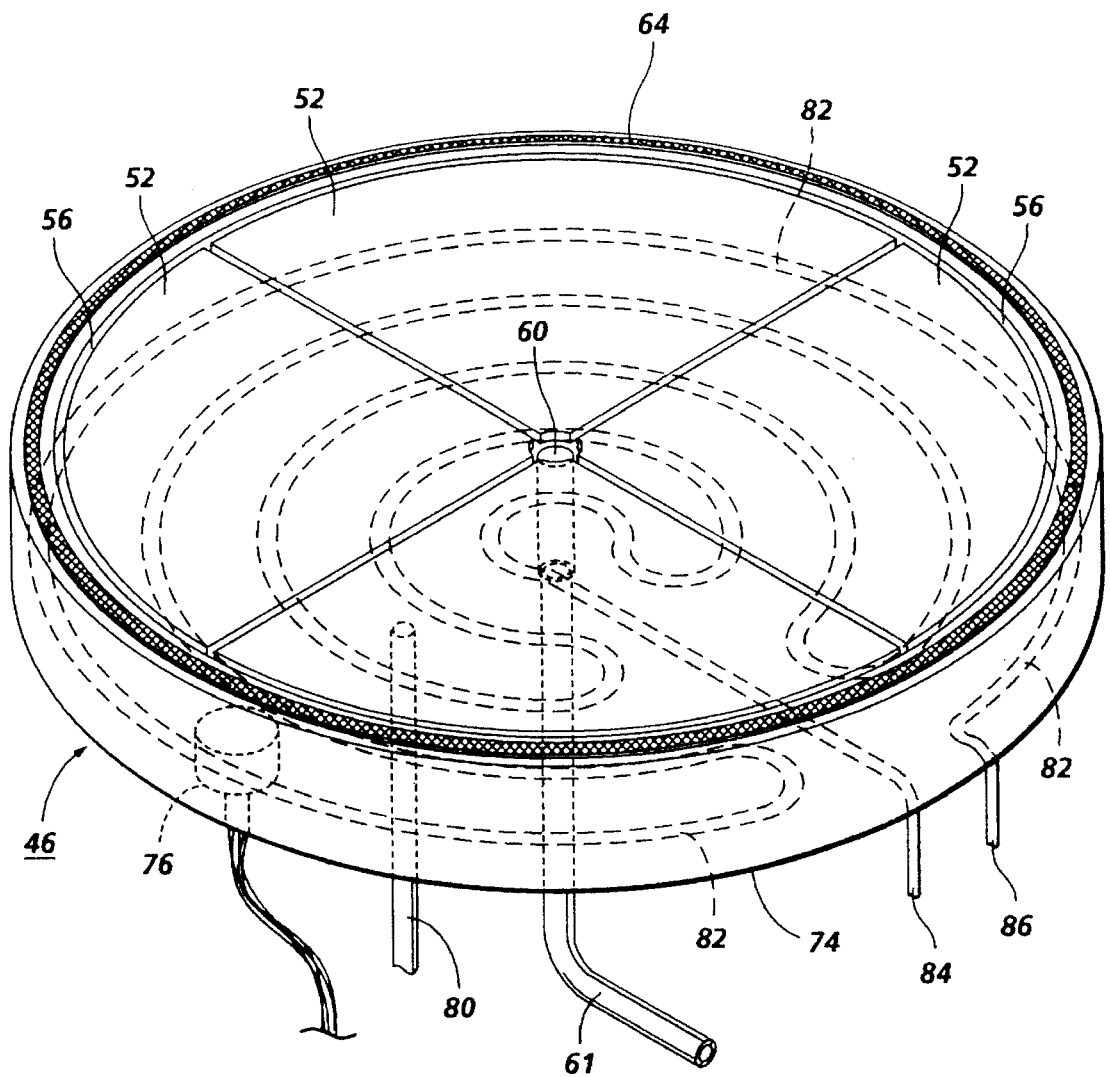
FIG. 4 is a perspective side view of the FIG. 2 platen including the connections to electrical, water and vacuum lines.

The platen 46 additionally includes a heater disc 74 seen in FIGS. 1 and 4. The heater disc 74 heats the platen during the bonding operation by heating up the surface 50 of the platen 46 through conductive heating. The heater disc 74 is coupled to a wiring harness 76 which carries electrical signals necessary to control of the amount of heat generated by the heater disc 74. The amount of heat is measured by a thermocouple 78 coupled to a conductor 80. The thermocouple 78 provides a signal indicating the amount of heat being measured at the surface 50. The amount of heat delivered to the surface 50 is controlled by control apparatus having a feedback control loop to maintain a constant temperature as would be understood by one skilled in the art.

In the present embodiment, the amount of heat delivered to the wafer pairs is approximately 130 degrees centigrade. The heat applied to the wafer pairs is established, in part, by the type of adhesive used. Higher heating temperatures are possible so long as the materials used to construct the platen and pressurization vessel can withstand such higher temperatures.

Figure 5:
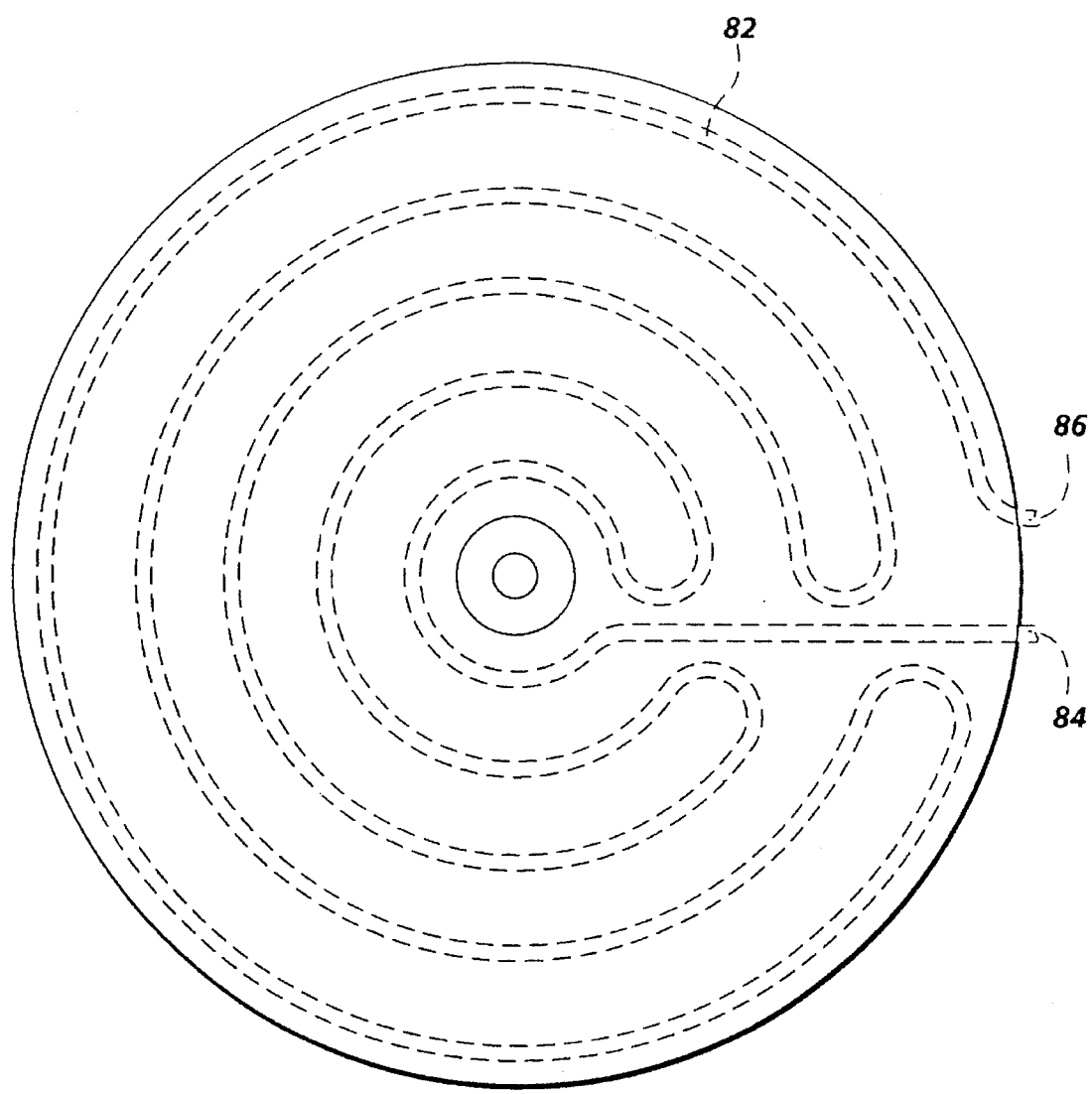
FIG. 5 is an illustration of one configuration of the water line used for cooling the platen.

To decrease the manufacturing time for bonding wafer pairs, the platen is cooled with water by a water cooling line 82 which runs through the platen above the heater disc 74. Water is directed through the cooling line 82 through an input 84 and through an output 86. While the present embodiment does not include a means for cooling the water, a radiator or some other cooling apparatus could be used to cool the water. FIG. 5 illustrates one possible configuration of the water line. The platen is currently manufactured by Watlow Electric Manufacturing Co. of St Louis, Mo.

The present invention can be operated either automatically or manually. To begin a bonding process, an operator places a wafer pair 54 on top of the platen in each of the regions 52. Once the wafer pairs 54 are in place, the operator places the mat 62 over the wafer pairs making sure that the mat completely covers each of the wafer pairs, the surface 50 around the entire periphery of each wafer pair, and the O-ring 64. Once the mat 62 is properly positioned, a vacuum is drawn through the vacuum line 61 which pulls the mat 62 to the surface 50 of the platen 46 and to the O-ring 64. This initial compression of the wafers holds the wafer pairs 54 in place without the need for fixtures for each wafer pair and also exerts a compressive force to enable pressure bonding of the heater wafer to the channel wafer.

Wafers, while manufactured to strict tolerances in a clean room environment, can and do have defects (typically unwanted raised portions) which not only cause the individual printhead to malfunction, but also affect adjacent printheads when the wafers are mated. In the present application, each element or die on the wafer can contain several hundred or more individual heaters or channels.

Any defect to an individual heater element or channel element can not only damage the associated element to which it is mated, but can also damage adjacent elements or dies since defects on either wafer can cause the channel wafer to be not parallel to the heater wafer when mated together during the bonding process.

The application of a constant downward pressure over the entire wafer by the application of the vacuum and the application of positive pressure inside the pressurization vessel, improves the manufacturability of the individual printheads. By using a vacuum to pull the mat down, not only are the wafer pairs held in place without the need for a holding fixture, but an equalized pressure is applied consistently to the surface of the top wafer. In the present invention, pressure is applied over the entire surface of the wafer instead of being applied inconsistently over the surface as with other methods. Because the wafers are brittle, prior art systems caused the mating surfaces to be not parallel or skewed with respect to one another. In the present invention, any damage occurring in the channel wafer resulting from defects in the heater wafer is very localized, because pressure is applied uniformly over the top surface of the channel wafer. The present method reduces the number of individual defects from causing secondary damage to adjacent arrays. In addition, the quality of the ink spot being jetted on paper is of much higher quality since any gaps between the channel plate and the heater plate are eliminated.

The application of this compressive force also tends to isolate any defects which may exist in either a heater wafer 88 or a channel wafer 90, as seen in FIG. 6. For instance, the heater wafer 88 may include a defect 92. In previous systems, the existence of the defect 92 would cause the mating surfaces of the wafers to be non-parallel or skewed with respect to one another as illustrated. This fact caused numerous defects to many individual printheads because one defect affected a wider area. Even though printheads might function if manufactured in this manner, the quality of the ink spots delivered by the individual ink jet nozzle suffered. Gaps between the heater wafer and the channel wafer caused ill-defined edges to the ink spots.

As seen in FIG. 6B, the present invention reduces the extent of damage due to a defect 92 in the heater wafer 88. Because the rubber mat 62 applies a more constant pressure over the entire surface of the wafer pair, defects tend to puncture through the channel wafer 90, and consequently, damage occurs to a single channel element contained in a channel wafer.

In addition, the application of the vacuum limits the amount of cracking and stress which can occur to the wafer pair during bonding. In the present embodiment, the heater is made of solid Silicon. The heaters are laid on top of the silicon and then a polyimide layer is spun on the heaters to provide electrical isolation. Because the polyimide layer is spun, however, the outer edges of the heater wafer have an excess amount of polyimide (sometimes called an edge bead) which must be removed. The edge bead is removed, so that the channel wafer mates properly to the heater wafer during compressive bonding of the wafers. Because the polyimide layer cannot be selectively removed, the entire layer at the outer edges of the disc is removed for a distance of approximately 3.5 millimeters from the outer circumference. The removal of the edge bead, however, leaves a gap at the outer edges between the heater and channel wafers. The outer circumferential surfaces of the discs, consequently, do not meet. This gap can cause defects due to stresses placed upon the wafers.

In the present invention, however, the application of the vacuum to the mat 62 causes the outer unsupported circumferential edges to break along a circumferential line thereby preventing the introduction of defects into other areas of the wafer pair. This cracking of the channel wafer reduces stresses to the channel wafer and provides for a better mating of the two wafers.

Once the vacuum has been pulled, the operator closes the lid by swinging the lid 14 into position around the pivot point 34 so that the lid 14 is centered over the bottom portion 16. Once the lid 14 is centered over the bottom portion 16, the handle 30 is rotated to cause the lid 14 to contact the O-ring 22. Once sufficient contact is made, toggle clamps 98 are closed on the lid to insure sealing of the pressurization vessel 12. The present invention uses four toggle clamps 98 placed ninety degrees apart around the outer circumference of the lid 14. Only two are shown for ease of illustration.

Once sealed, the wafer pairs are either processed manually by an operator, automatically by a programmed logic controller, or any combination of the two. The vessel 12 is pressurized through an input pressurization line 100 and heat is applied to the wafer pairs by the heater disk 74. The vessel 12 is pressurized to approximately 60 PSI in the present embodiment. Other pressures are also possible, of course, as long as the pressurization vessel 12 is constructed to hold and maintain the desired pressure. The pressurization vessel 12 applies pressure to the top surface of the mat 62 which at the same time is being pulled down by the vacuum. The addition of two pressures provides a greater amount of pressure for bonding.

The seal between the O-ring 64 and mat 62 isolates the vacuum source from the pressurization source thereby preventing damage to the vacuum pump. In addition, because a vacuum seals the mat 62 to the O-ring 64 instead of a mechanical device, the mat 62 is very conformable to the wafer pairs below since no mechanical constraints are present.

The heater disk is heated to a temperature of 130 degrees Centigrade. The heat and pressure in the present embodiment are then maintained for approximately 1 hour to cause the adhesive layer between the wafers to substantially cure. In the present application, the adhesive layer is not completely cured by this operation, since it has been found that better results are obtained in the dicing operation of the wafers into printheads if the adhesive is not fully cured. Of course, complete curing can be accomplished by this method also. Once the time period is complete, the heater disc 74 is turned off, and water is sent to the water line to cool the platen. Once room temperature is reached on the platen, the vessel is evacuated though the evacuation line 102 and the vacuum provided through the vacuum line 61 is turned off. At this time, the operator can remove the wafer pairs and begin a new operation.

In recapitulation, there has been described a method and apparatus for bonding printhead wafers or any assembly requiring the application of compressive forces and/or heat. It is, therefore, apparent that there has been provided in accordance with the present invention, a method and apparatus for bonding wafer pairs that fully satisfies the aims and advantages hereinbefore set forth. While this invention has been described in conjunction with a specific embodiment thereof, it is evident that many alternatives, modifications, and variations will be apparent to those skilled in the art. Accordingly, the invention is intended to embrace all such alternatives, modifications and variations that fall within the spirit and broad scope of the appended claims.

We claim:

1. An apparatus for bonding a plurality of component pairs, comprising:

a support member including at least one channel, adapted to form a vacuum and dividing said support member into a plurality of substantially planar surface regions, each of said plurality of regions being adapted to support at least one of the plurality of component pairs;

a flexible member having a first surface and a second surface, defining with said support member a plurality of vacuum chambers, each of the vacuum chambers being defined with one of said plurality of substantially planar regions, said first surface cooperating with said support member to form means for holding the plurality of component pairs in position without the application of a mechanical holding means to said second surface;

a heater for heating the plurality of component pairs; and a positive gas pressure member defining a positive gas pressure chamber having at least said support member and said flexible member disposed therein, said positive gas pressure member increasing the pressure in the positive gas pressure chamber to effect bonding of the plurality of component pairs.

2. The apparatus for bonding of claim 1, further including a vacuum source coupled to said support member adopted to decrease the pressure in the vacuum chamber.

3. The apparatus for bonding of claim 2, wherein the at least one channel is coupled to said vacuum source.

4. The apparatus for bonding of claim 3, wherein said support member comprises means for sealing said flexible member to said support member in response to the pressure in the vacuum chamber being decreased.

5. The apparatus for bonding of claim 4, wherein:

said support member includes a groove; and said sealing means comprises a sealing gasket placed in the groove.

6. The apparatus for bonding of claim 5, wherein said flexible member comprises a single piece flexible member.

7. The apparatus for bonding of claim 4, wherein a depth of the channel is greater than a width thereof.

8. The apparatus for bonding of claim 7 wherein the channel is triangular in shape.

9. The apparatus for bonding of claim 8, wherein said heater is integral to said support member to thereby heat the component pair.

10. The apparatus for bonding of claim 9, wherein said heater comprises a heater disc.

11. The apparatus for bonding of claim 10, wherein said support member further comprises means for cooling said support member.

12. The apparatus for bonding of claim 11, wherein said cooling means comprises a serpentine shaped conduit.

13. The apparatus for bonding of claim 12, wherein said conduit transports a cooling liquid.

14. The apparatus for bonding of claim 13, wherein said flexible member comprises a static conductive rubber sheet.

15. The apparatus of claim 1, further comprising a positive gas pressure source coupled to said positive gas pressure member for increasing the pressure in the positive gas pressure chamber.

16. The apparatus of claim 1, wherein each of said plurality of substantially planar surface regions is larger than the component pair being adapted to be supported thereby.

* * * * *